United States Patent [19]
Rodwell et al.

[11] Patent Number: 5,945,879
[45] Date of Patent: Aug. 31, 1999

[54] SERIES-CONNECTED MICROWAVE POWER AMPLIFIERS WITH VOLTAGE FEEDBACK AND METHOD OF OPERATION FOR THE SAME

[75] Inventors: Mark Rodwell; Shrinivasan Jaganathan, both of Goleta, Calif.; Scott T. Allen, Apex, N.C.

[73] Assignee: The Regents of the University of California, Oakland, Calif.

[21] Appl. No.: 09/019,329

[22] Filed: Feb. 5, 1998

[51] Int. Cl.[6] .................................................. H03F 3/04
[52] U.S. Cl. ............................................. 330/310; 330/294
[58] Field of Search ..................................... 330/310, 311, 330/286, 293, 294

[56] References Cited

U.S. PATENT DOCUMENTS

| | | | |
|---|---|---|---|
| 2,594,449 | 4/1952 | Kircher | 171/97 |
| 4,075,576 | 2/1978 | Eden | 330/277 |
| 4,232,272 | 11/1980 | Fabri | 330/294 |
| 5,032,799 | 7/1991 | Milberger et al. | 330/311 |
| 5,408,198 | 4/1995 | Kusunoki | 330/277 |

*Primary Examiner*—Robert Pascal
*Assistant Examiner*—Henry Choe

[57] ABSTRACT

A microwave power amplifier is comprised of a plurality of series connected amplifier stages. Each stage is provided with a local negative feedback. The addition of the local voltage feedback distribution networks provide correct voltage distribution and equal current distribution for all transistors, such that the peak-to-peak voltage and current swings of each transistor can be set simultaneously to the values required for efficient amplifier operation. The method applies to both FETs and bipolar transistors. The series connected microwave power amplifier is thus characterized as a stack with local voltage feedback networks which provide an equal distribution of voltage across the transistors in the stack. The amplifier stages can be biased and tuned to collectively operate either as a class A or B amplifier.

25 Claims, 10 Drawing Sheets

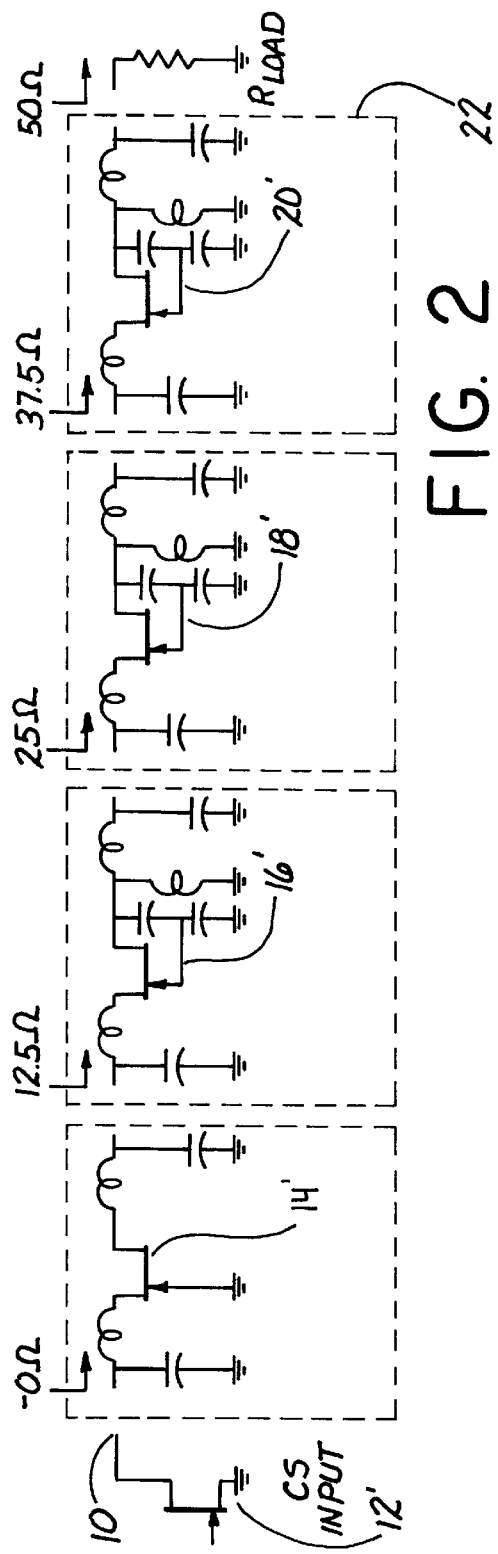
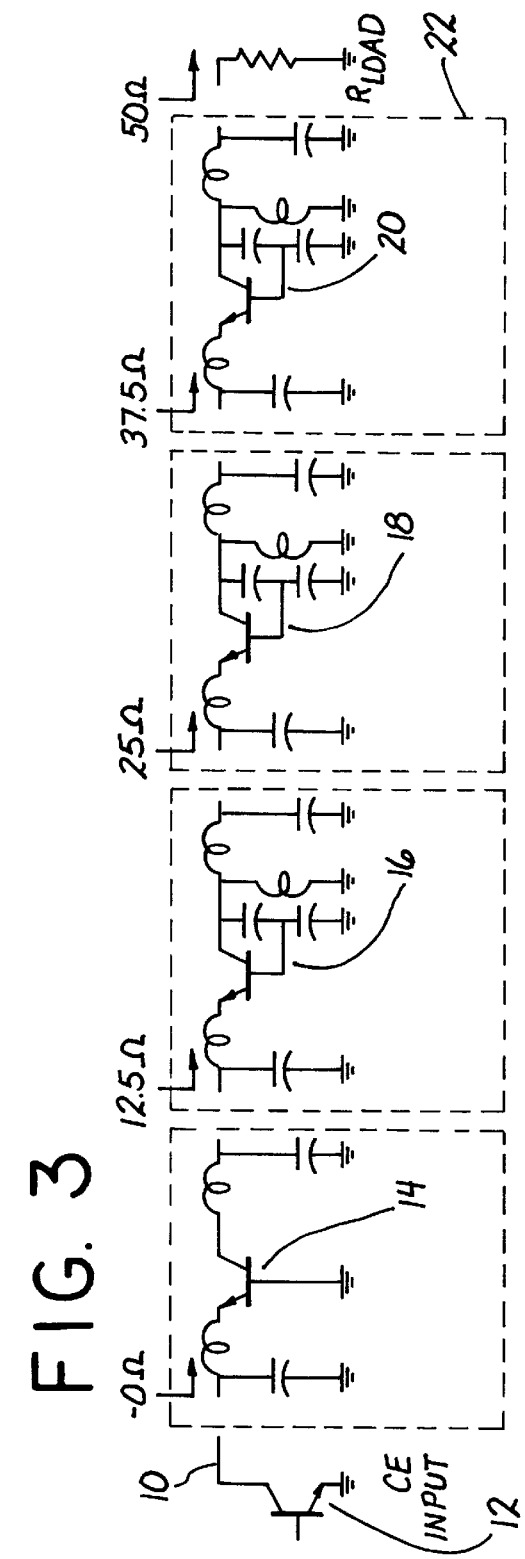
FIG. 2
FIG. 3

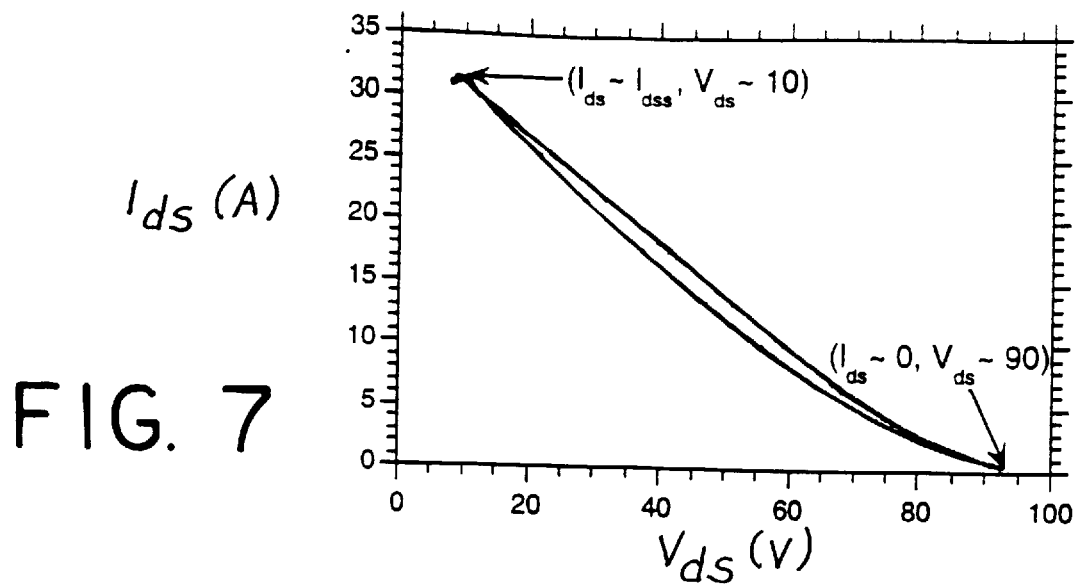
FIG. 7
FIG. 8
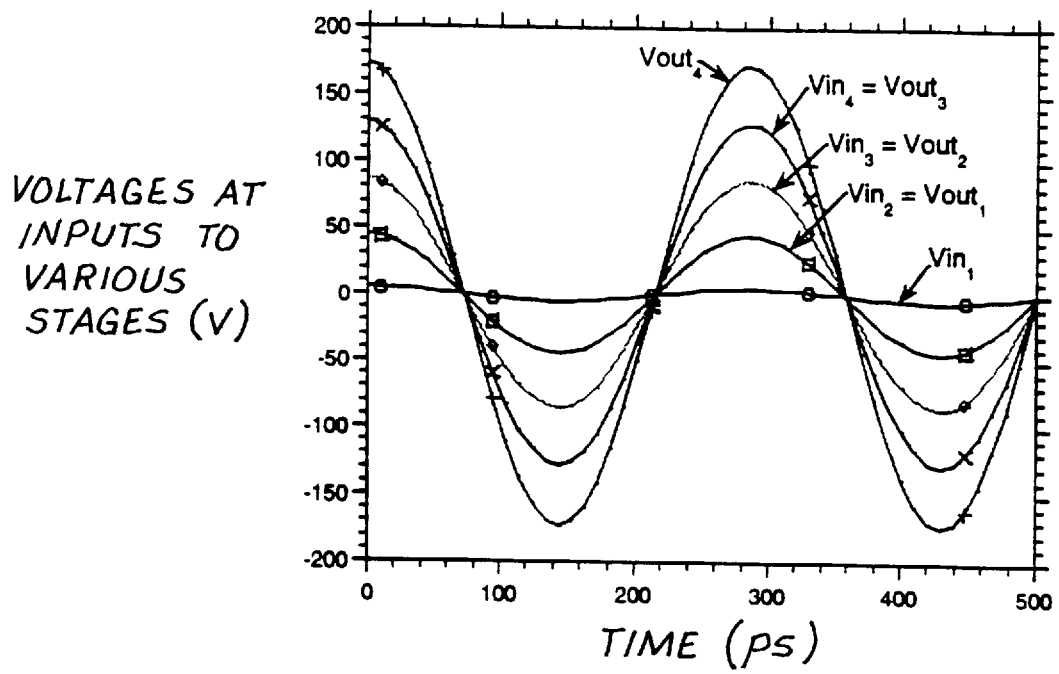

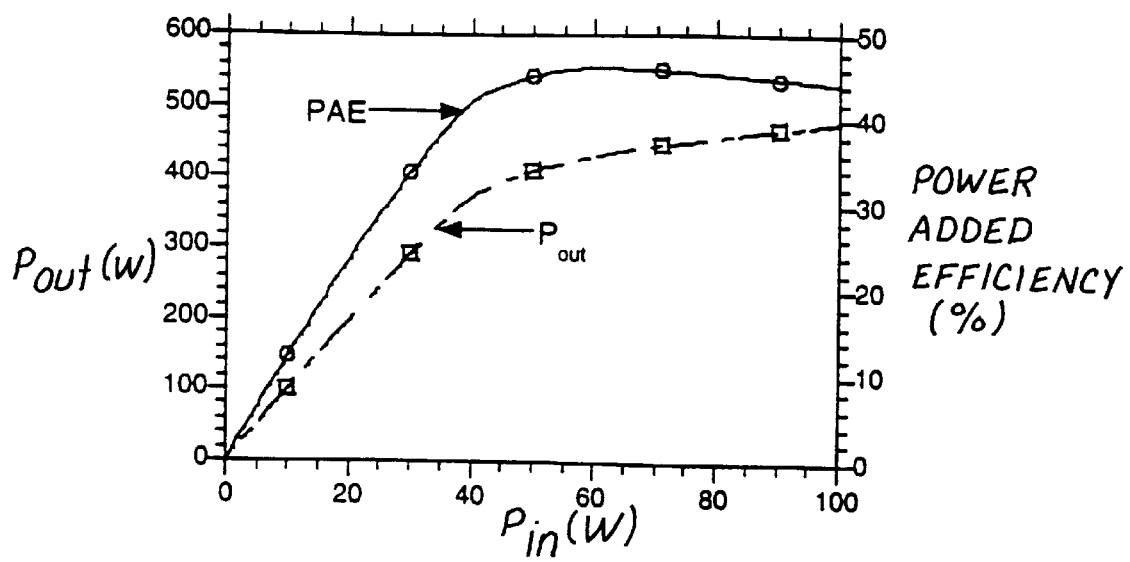
FIG. 9
FIG. 10
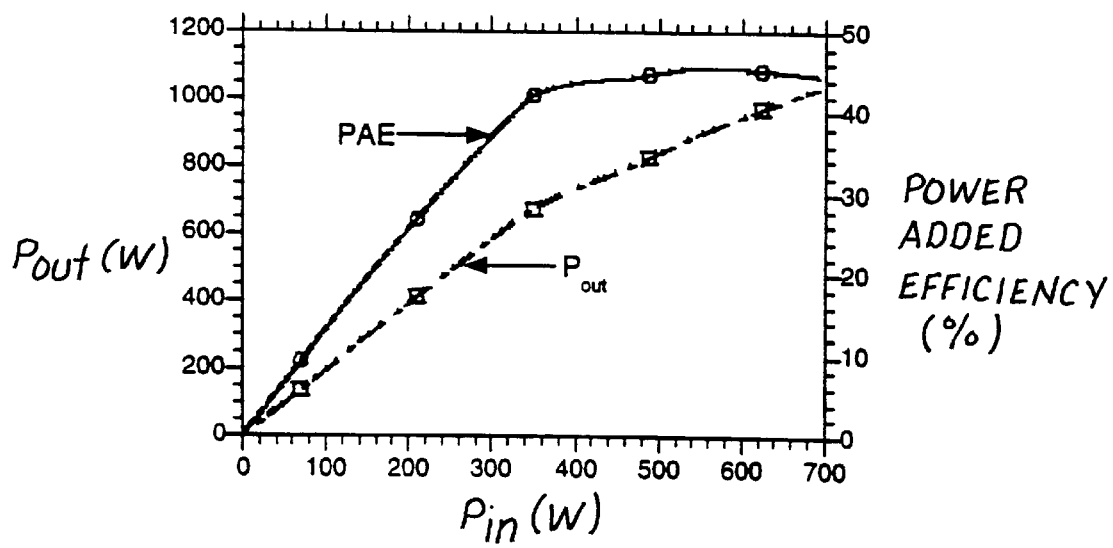

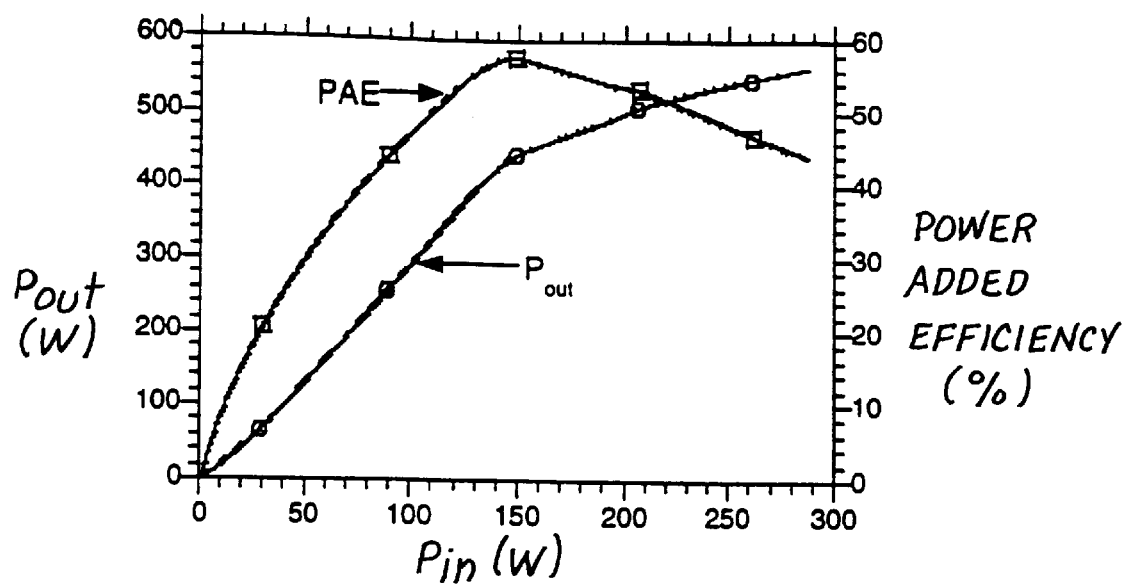
FIG. 15
FIG. 16
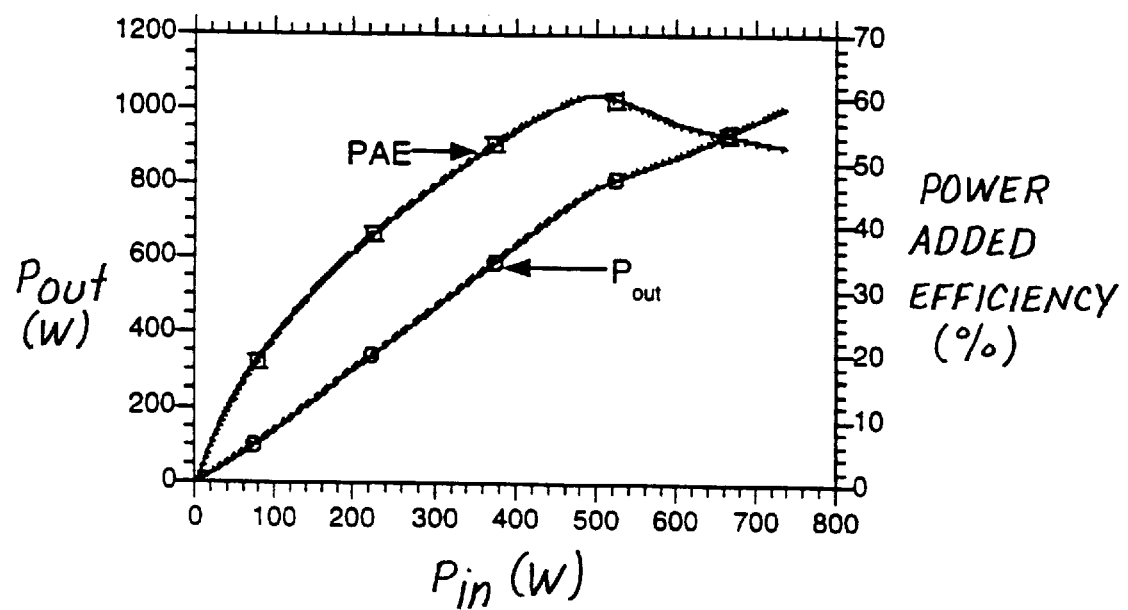

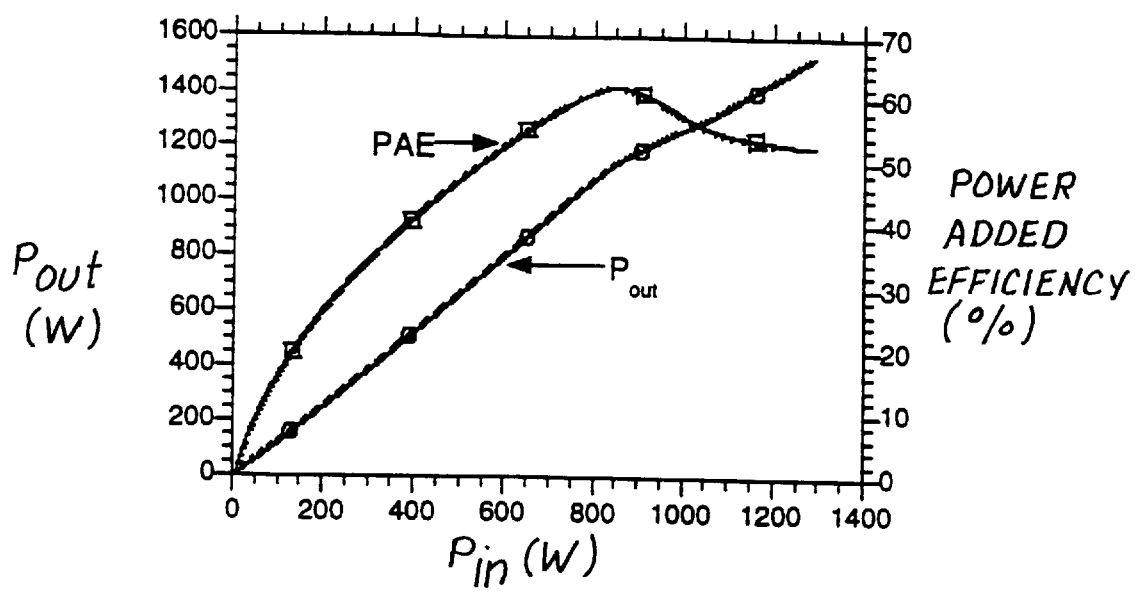
FIG. 17
FIG. 18
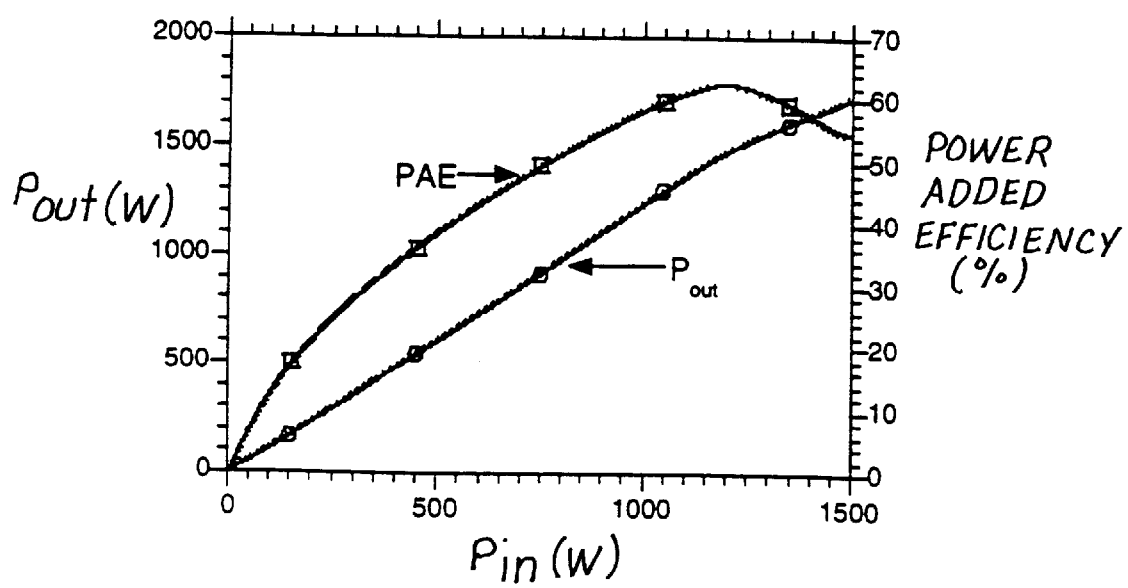

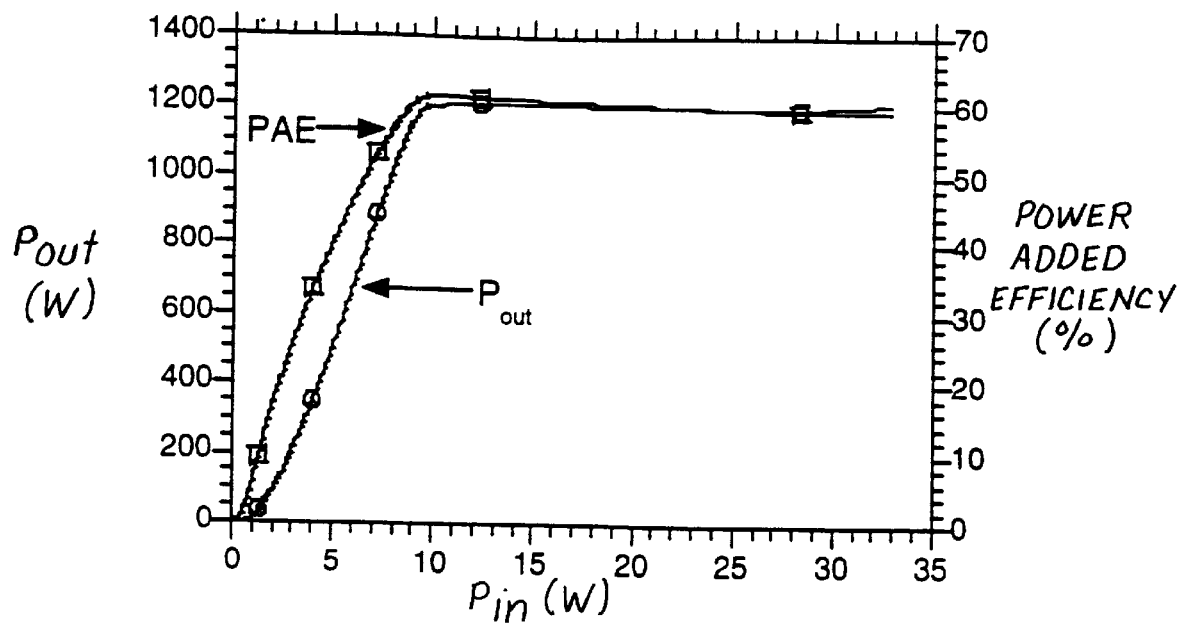
FIG. 19
FIG. 20
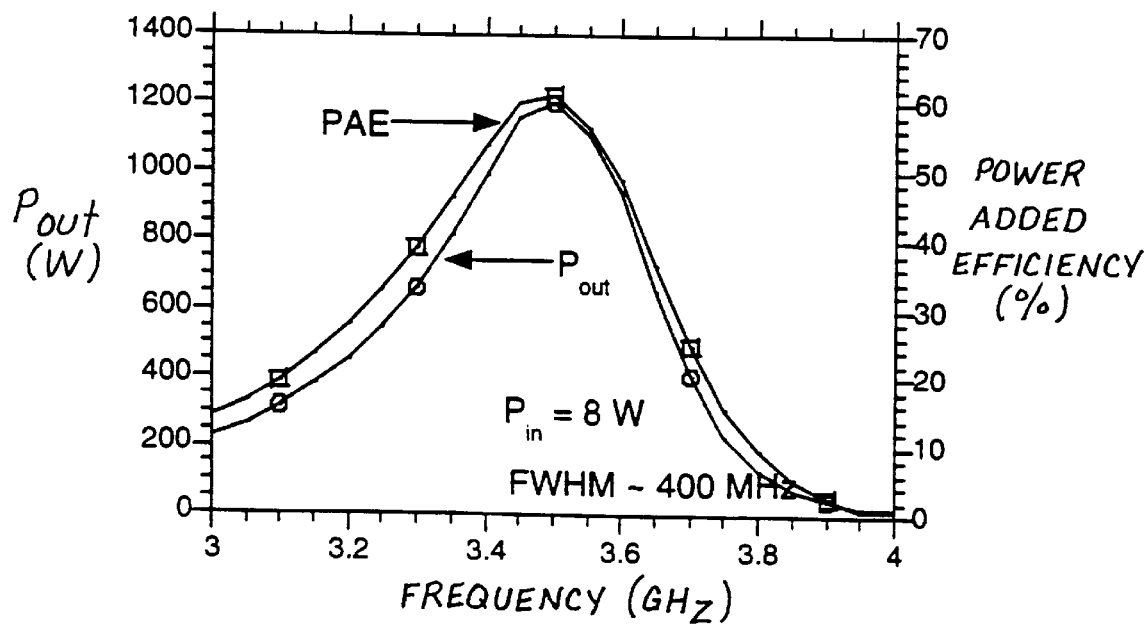

SERIES-CONNECTED MICROWAVE POWER AMPLIFIERS WITH VOLTAGE FEEDBACK AND METHOD OF OPERATION FOR THE SAME

This invention was made with Government support under Grant No. N00014-96-C-2152 awarded by the Navy. The Government has certain rights in this invention.

BACKGROUND OF THE INVENTION

1. Field of the Invention

The invention relates to the field of microwave transistor power amplifiers in a series configuration using a local feedback network to share power among a plurality of transistors for increased output power.

2. Description of the Prior Art

Traditionally, the microwave power amplifiers are designed in common source or common gate configuration, with the device size being determined by the required output power. Large device sizes ("device periphery") give large drive currents, but with invariant maximum device voltages with output power as the product of these two factors. With the voltage swing at the drain of the field effect transistor, FET, limited by the breakdown voltage of the transistor, obtaining large output powers results in very low and unfeasible values of load resistor.

The output power levels obtained from solid state microwave sources have been limited by a combination of factors involving semiconductor device physics, transmission line losses, and circuit implementation. These factors in combination lead to a maximum output power varying as the inverse square of the operating frequency, referred to as the $Pf^2$ limit. The $Pf^2$ limit arises through the combination of low breakdown voltages for high frequency transistors and high skin effect losses from low impedance transmission lines. In any microwave transistor, whether a MEtal Semiconductor Field Effect Transistor (MESFET), a High Electron Mobility Transistor (HEMT) or a bipolar transistor, there are two electron transport regions, a control region and a high field drift region. In MESFETs the control region is under the gate electrode, while the high field drift region is the lateral extension of the depletion layer between gate and drain.

To obtain a high current gain cutoff frequency essential for high frequency operation, the transit time for the drift region must be small. This transit time is given by $\tau_{drift} = D_{drift}/2v_{sat}$, where $D_{drift}$ is the length of the drift region and $v_{sat}$, the electron velocity. Since the current gain cutoff frequency, $f_\tau$, is inversely proportional to this transit time, $$f_\tau = v_{sat}/\pi D_{drift}$$

assuming that drift region dominates the total transit time.

The drift region serves to support the transistor's output voltage, and can support some maximum field $E_{max}$. The transistor breakdown voltage, $V_{br}$, is the product of this maximum field, $E_{max}$, and the thickness of the layer, $V_{br} = E_{max}D_{drift}$. As a result, transistors designed for high breakdown voltage have thick drift regions with long electron transit times, hence low current gain cutoff frequencies. The breakdown voltage varies inversely with the current gain cutoff frequency, $V_{br} \, E_{max}v_{sat}(f_\tau)^{-1}$, and consequently high frequency transistors have low breakdown voltages.

If the transistor is operated into some load resistance $R_L$, then the maximum power level which can be delivered to the load resistance is $P_{max}=V_{br}^2/8 \, R_L$. Consequently, $P_{max} \, 1/f^2$, where f is the operating frequency. This is the $Pf^2$ limit.

The $Pf^2$ limit exists only because a fixed minimum load resistance exists. As we scale the FET gate width, the transistor's available drive current increases proportionally. With a maximum peak-to-peak voltage swing of $V_{br}$, the FET gate width is chosen so that the transistor current $I_{dss}$, which is the drain-to-source saturation current, is the required peak-to-peak output current, $V_{br}/R_L$. The maximum available output power from the transistor is $V_{br}I_{dss}/8$, which increases without limit as we increase the FET gate width. But, with a minimum load resistance $R_L$, further increases in $I_{dss}$ beyond $V_{br}/R_L$ do not increase the output power beyond $V_{br}^2/8R_L$, and the excess available transistor drive current is wasted.

Low values of load resistance $R_L$ are a major difficulty because of several factors. First, very low load resistances are not compatible with microwave connectors, transmission lines, microwave antennas, or other components, all of which are designed to operate into a standard 50 ohm interface impedance. Secondly, and more fundamentally, low circuit resistances result in substantial microwave power losses through skin effect resistances in the microwave connections, losses which become progressively more severe as the circuit impedance levels are reduced.

There are several standard microwave circuit design techniques which only partly alleviate this difficulty. At low frequencies, wire wound transformers are used to obtain a low load resistance. In an equivalent approach, at higher frequencies output reactive impedance matching networks are used to obtain a low transistor load impedance. The problems with these approaches are as follows. First, wire wound transformers do not function well at microwave frequencies, and impedance matching networks must instead be used. Secondly, matching networks of high impedance transformation ratios are hard to realize, are very sensitive to device parameters, and do not work over a broad frequency range. Third, the impedance matching networks themselves are transmission line systems with skin effect losses, and low transformed load resistances are obtained only at the penalty of significant skin effect power losses within the impedance matching network. The conclusion is that impedance transforming networks increase the attainable saturated power to a significant factor, but that there are maximum feasible transformation ratios which place limits on the attainable improvement in the saturated output power.

To see this concretely, consider a typical design problem. A GaAs power HEMT with transistor bandwidth sufficient for S-band operation will have ~10 Volts breakdown. If 10 watts saturated output power is required, the resulting required load resistance (calculated from $P_{max}=V_{br}^2/8R_L$) is 1.25 ohm. An impedance matching network transforming 1.25 ohm to 50 ohm will have a fractional bandwidth on the order of 2 to 5 percent, will be very big, and will have very high skin effect losses.

A third standard microwave power design technique is the use of power combining networks. One designs a transistor power amplifier stage with the highest feasible saturated output power. Taking two such power amplifiers, the power from an input signal source is divided equally between the two transistors using a 2:1 power dividing network (e.g. a Wilkinson or Lange Coupler). The output powers of the two transistors are recombined in a second Wilkinson or Lange power combiner, and the power delivered to the load. In this manner the saturated output power is increased 2:1. The saturated output power can be increased 2:1, 4:1, 8:1, 16:1, etc., by repeating the power combining technique in multiple steps. The limitations to such "corporate" power combining networks are similar to those of impedance matching networks for microwave power amplifier designs, namely as the level of power combining is increased, the physical size of the power combiners increases, their skin effect losses increase, and the feasible system bandwidth decreases.

The above summarizes the state of the art in microwave power amplifier design. Typical microwave power amplifiers use a combination of impedance matching and corporate power combining to obtain the required output power levels. Losses in the power combining networks and impedance matching networks place limits on the maximum number of power combining stages N and the maximum impedance transformation ratio, hence the minimum feasible load resistance $R_L$. The maximum power obtainable is then $$P_{max} = NV_{br}^2/R_L$$

The limit is severe. Transistor power amplifiers at microwave frequencies have relatively lower power, low bandwidth, and only moderate efficiency. Some 45 years after the invention of the transistor, vacuum electron devices (tubes) are still used heavily for microwave amplifiers in military radar systems.

What is needed is some type of innovative circuit topology that distributes the output voltage across many transistors, thus allowing output voltages several times the breakdown voltage of the transistors employed. Thus, large output power at microwave frequencies could be delivered into a large load with high efficiency. Prior attempts at this method have failed due to the method applied for sharing the total voltage between the several devices.

BRIEF SUMMARY OF THE INVENTION

The invention is a microwave amplifier comprising a plurality of series connected stages wherein each stage comprises a transistor having an output, and a negative feedback network coupled to the output of the transistor and feeding back a signal to the transistor to provide a substantially equal distribution of voltage across the plurality of transistors in the corresponding plurality of stages. As a result, increased power performance of the amplifier is achieved. The transistor may take the form of a field effect transistor or a bipolar junction transistor.

The microwave amplifier further comprises a current driver input stage coupled to a first one of the plurality of series connected stages. In one embodiment the current driver input stage comprises a common source current driver, while in another it comprises a common emitter current driver. The present invention is not restricted only to the use of a DC biasing circuit in parallel with a plurality of series connected stages. DC biasing can also be applied in series such that the current in all series connected transistors is simultaneously set by appropriate voltage sources at the ends of the series.

The microwave amplifier further comprises a DC biasing circuit in parallel with each of the plurality of series connected stages. An RF input signal is applied in series to the plurality of series connected stages. The DC biasing circuit provides only two DC power supply voltages in parallel for each of the plurality of series connected stages.

Each stage further comprises a first load line matching circuit coupled to the input of the transistor and second load line matching circuit coupled to the output of the feedback network. In one embodiment the plurality of series connected stages are each biased for class A operation. In another embodiment the plurality of series connected stages are each biased and tuned for class B operation. In the case where the transistor of each stage is a field effect transistor with a source-drain voltage, $V_{ds}$, the biasing circuit biases the field effect transistor at optimum efficiency where the drain current and the source-drain voltage, $V_{ds}$, are in phase with each other. The transistor of each stage is driven through its corresponding maximum input voltage input range for maximum power output. The feedback network of each stage is tuned to provide a voltage gain of the stage of $(N+1)/N$ where N is the cardinal number of the corresponding stage among the plurality of stages. The first load line matching circuit of each stage is tuned to provide an input impedance of the stage of $Z_{in\,N}=(N-1)\,V_{breakdown}/I_{dss}$, where $Z_{in\,N}$ is the input impedance of the Nth stage of the plurality of stages, where N is the cardinal number of the corresponding stage among the plurality of stages, $V_{breakdown}$ is the breakdown voltage of the Nth stage, and $I_{dss}$ is the source-to-drain saturation current of the Nth stage. The second load line network of each stage provides a load impedance for an Nth stage given by $Z_{load\,N}=N\,V_{breakdown}/I_{dss}$, where $Z_{load\,N}$ is the load impedance of the Nth stage.

For class B operation the DC biasing circuit biases the transistor in each of the stages at cutoff and wherein the first and second load line networks are each harmonic terminations. Harmonic terminations for class B tuning are networks providing short circuit at the second harmonic frequency and the desired output impedance at the fundamental frequency.

The feedback networks in the stages provide a voltage distribution and equal current distribution among the corresponding transistors in the plurality of stages so that peak-to-peak voltage and current swings in each of the corresponding transistors in the plurality of stages are simultaneously set for efficient operation of the amplifier. The voltage across the plurality of stages is equally distributed across the plurality of corresponding transistors.

The invention is also defined as a method of operating a microwave amplifier comprising a plurality of series connected stages comprising the steps of providing an input signal to a selected one of the plurality of series connected stages, and amplifying the input signal by a transistor in the corresponding stage provided with a local negative feedback having a feedback gain $\beta_{fb} \approx N/(N+1)$, where N is the cardinal number of the corresponding stage among the plurality of stages to provide an output signal from the corresponding stage to serve as an input signal to a next one of the series connected stages. The steps of providing the input signal and amplifying the signal are repeated in sequence for each of the stages of the plurality of stages.

The invention now having been summarized can be better visualized by turning the following drawings wherein like elements are referenced by like numerals.

BRIEF DESCRIPTION OF THE DRAWINGS

FIG. 2 is a schematic which shows a four transistor, series connected power amplifier in a common gate configuration;

FIG. 3 is a schematic which shows a bipolar implementation of the amplifier with MESFETs replaced by a microwave power bipolar transistor in a common base configuration;

FIG. 7 is a graph which shows the dynamic load line of the FET transistor in FIGS. 5 and 6;

FIG. 8 is a graph which shows the voltages at the input of each stage in the stack of FIG. 5;

FIG. 9 is the graph for class A operation of the first stage of FIG. 5;

FIG. 10 is for class A operation for that of the second stage of FIG. 5;

FIG. 15 is the graph for class B operation of the first stage of FIG. 5;

FIG. 16 is that for class B operation of the second stage of FIG. 5;

FIG. 17 is that for class B operation of the third stage of FIG. 5;

FIG. 18 is that for class B operation of the fourth stage of FIG. 5;

FIG. 19 is that for class B operation of all four stages of FIG. 5; and

FIG. 20 analogous to FIG. 14 shows the frequency response for the stack operating at its optimum input power in Class B operation.

The invention having been illustrated in the foregoing drawings, turn now and consider the invention and its various embodiments as set forth in the following detailed description.

DETAILED DESCRIPTION OF THE PREFERRED EMBODIMENTS

The circuit topology described hereafter can be applied to any microwave or high frequency transistor. Use of high breakdown transistors such as those made from silicon carbide (SiC) or indium gallium nitride (InGaN) is advantageous. In order to make further discussion more clear, we will consider a design case study with 100 V breakdown SiC MESFETs with about a 10 GHz current gain cutoff frequency. The conclusions of the analysis are nevertheless, general, and independent of the transistors used. Using the high breakdown SiC MESFETs, combined with a series connected transistor circuit, maximum signal swings of several hundred volts will be directly feasible. Even without impedance tuning, with a direct 50 ohm load, saturated power levels of approximately 300 watts per module should be feasible. With the addition of moderate levels of load impedance tuning and power combining, output power levels may approach a few kW at S-band.

Figure 1:
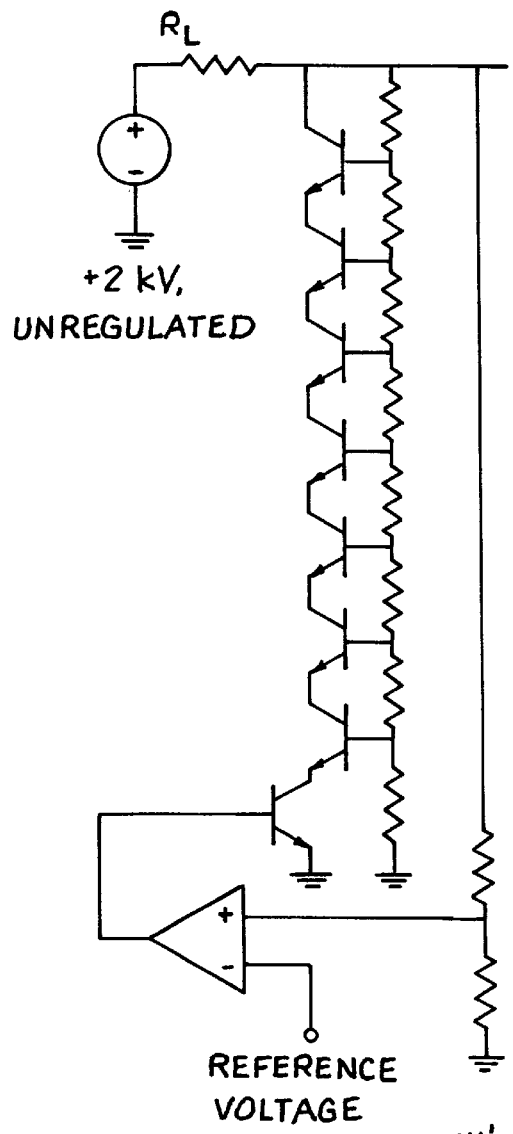
FIG. 1 is a schematic of a prior art totem pole regulator.

Transistor amplifiers with output voltages many times the transistors breakdown voltage are feasible, and a number of such circuits have been reported for low frequency applications. The most common example is that of kilovolt voltage regulators for vacuum tube power supplies. Kilovolt voltage regulators use series connected transistors to permit high operating voltages. To connect devices in series, the drive voltages to all transistors are distributed globally through voltage feedback on a multitap voltage divider connected between the output and the supply as shown in FIG. 1, which is a schematic of a prior art totem pole regulator.

The problem is to adapt such designs to microwave frequencies, frequencies at which the transistor has substantial parasitics and low gain. Indeed, such an attempt at microwave frequencies was published by Shifrin, M, Ayasli, Y and Katzin, P., "A New Power Amplifier Topology with Series Biasing and Power Combining of Transistors", IEEE Microwave and Millimeterwave Monolithic Circuits Symposium Digest, pp. 39–41, Jun. 1–3 1992, but showed very poor performance.

The innovation introduced by the present invention is a method of distributing the total output voltage equally between the transistors in the series, despite the presence of serious transistor parasitics. FIG. 2 is a schematic which shows a four transistor, series connected power amplifier in a common gate configuration. FIG. 3 is a schematic shows a bipolar implementation of the amplifier with MESFETs replaced by a microwave power bipolar transistor in a common base configuration. Though the following discussion will assume a FET based design, it can be extended to bipolar junction transistors in a straightforward manner.

FIGS. 2 and 3 show the FET and bipolar implementations, respectively, of the series connected amplifier. Considering the FET implementation first the input 10 in FIG. 2 is driven with a Common source stage 12'. Assume a 100 volt transistor breakdown, typical of the high breakdown SiC MESFETS, for each of the transistors 14', 16', 18', and 20' in FIG. 3. If the signal swings at the drains of the transistors 14', 16', 18', and 20' are 100, 200, 300, and 400 volts peak-to-peak, then each transistor 14', 16', 18', and 20' supports a 100 volt peak-to-peak signal swing. So that all the transistors 14', 16', 18', and 20' reach breakdown simultaneously, the input (source) voltage swings of the Nth common gate must be N/(N+1) times the output (drain) voltage swings, e.g., the Nth stage must have a voltage gain of N(N+1). The voltage gain of each common gate stage is reduced to this relatively low level by use of a local negative feedback network having $\beta_{fb}=N/(N+1)$ where $\beta_{fb}$ is the feedback gain. With four series connected devices (each having a 4:1 increased $I_{dss}$ through a 4:1 increase in gate width), the maximum voltage swing is increased 4:1 and the saturated output power is increased 16:1. $I_{dss}$ is the drain-to-source saturation current.

In the bipolar implementation (FIG. 3), the input 10 is driven with a Common emitter stage 12. Assume a 10 volt breakdown voltage for each of the transistors 14, 16, 18, and 20 in FIG. 2. If the signal swings at the collectors of the transistors 14, 16, 18, and 20 are 10, 20, 30, and 40 volts peak-to-peak, then each transistor 14, 16, 18, and 20 supports a 10 volt peak-to-peak signal swing. So that all the transistors 14, 16, 18, and 20 reach breakdown simultaneously, the input (emitter) voltage swings of the Nth common base cell must be N/(N+1) times the output (collector) voltage swings, e.g., the Nth stage must have a voltage gain of N(N+1). The voltage gain of each common base stage is reduced to this relatively low level by use of a local negative feedback network having $\beta_{fb}=N/(N+1)$ where $\beta_{fb}$ is the feedback gain. With four series connected devices (each having a 4:1 increased $I_c$ through a 4:1 increase in transistor periphery), the maximum voltage swing is increased 4:1 and the saturated output power is increased 16:1. Thus, the output power exceeds the $Pf^2$ limit in the case of both FET and bipolar implementations.

Figure 4:
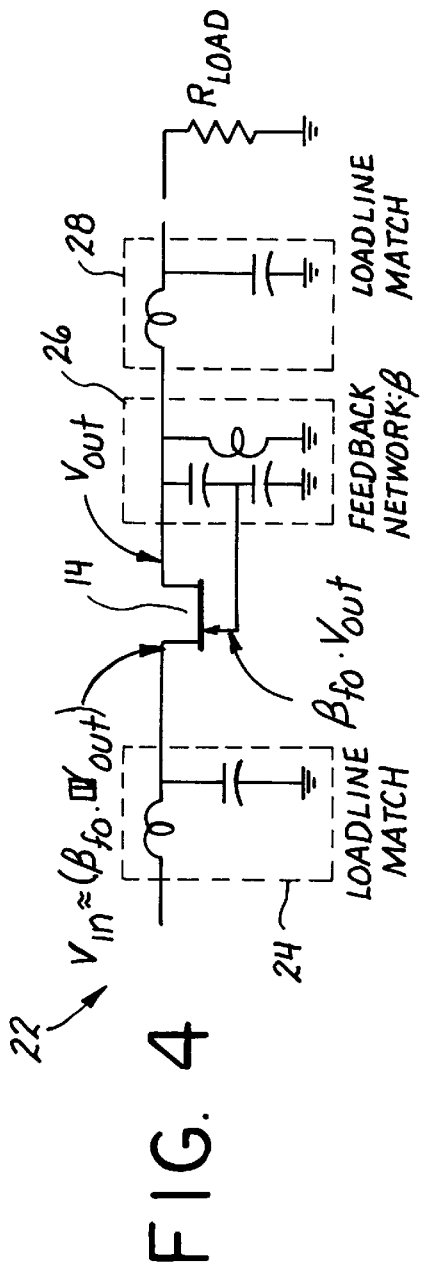
FIG. 4 is a schematic which shows the amplifier broken into individual and independent single transistor power amplifier stages with local feedback networks setting the gain of each stage.

The amplifier is broken into individual and independent single transistor power amplifier stages 22 shown in the schematic of FIG. 4 with local feedback networks setting the gain of each stage 22. Each stage 22 is designed for maximum power output (each FET swings the maximum possible $V_{ds}$, where $V_{ds}$ is the drain-to-source voltage). Transistor 14', 16', 18' or 20' for example has its input coupled to a network 24, which provides load line match for the stage in front of it, which is implemented as an LC network. The input to the source of transistor 14', 16', 18' or 20' is then $V_{in} \approx \beta_{fb} V_{out}$. The signal on the drain of transistor 14', 16', 18' or 20' is $V_{out}$. $V_{out}$ is coupled to a feedback network 26 implemented as a parallel inductance L and split capacitor C from a center tap of which the feedback signal $\beta_{fb} V_{out}$ is taken and applied to the gate of transistor 14', 16', 18' or 20'. The output of network 26 is then coupled to loadline matching network 28 which provides the output of stage 22. The output voltage from stage 22 is the input voltage plus the breakdown voltage of the amplifier, namely $\Delta V_{out\ peak-to-peak\ max} = V_{breakdown} + \Delta V_{input\ peak-to-peak}$. The voltage gain is about $1/\beta$ as set by the feedback network parameters. By maintaining consistency of power and impedance levels between stages 22, efficient operation is ensured. For the $N^{th}$ stage an output matching network provides a load impedance of $$Z_{load\ N} = \Delta V_{out}/\Delta I_{out} = N\ V_{breakdown}/I_{dss}$$

the feedback network is tuned to give a voltage gain of $(N+1)/N$, and the input is tuned to give an input impedance of $$Z_{in\ N} = \Delta V_{in}/\Delta I_{in} = (N-1)V_{breakdown}/I_{dss}$$

This is always possible if $(N+1)/N$ does not exceed the transistor operating power gain $G_p$. In the absence of parasitics the process described above is very straightforward. But, at microwave frequencies, the proper compensation formed and proper compensation for them is critical for efficiency. Formal mathematically based design procedures have been developed as a part of the design methodology for systematic design of tuning network within each stage 22 to compensate for the transistor parasitics. In this manner, the element values required for an equal distribution of the voltage, are readily obtained.

In this design study, series connected microwave power amplifier outlined above, has been designed using SiC MESFETs for high power class A operation at 3.5 GHz. The technique has then been extended to class B operation to obtain a power added efficiency of about 60%.

Figure 5:
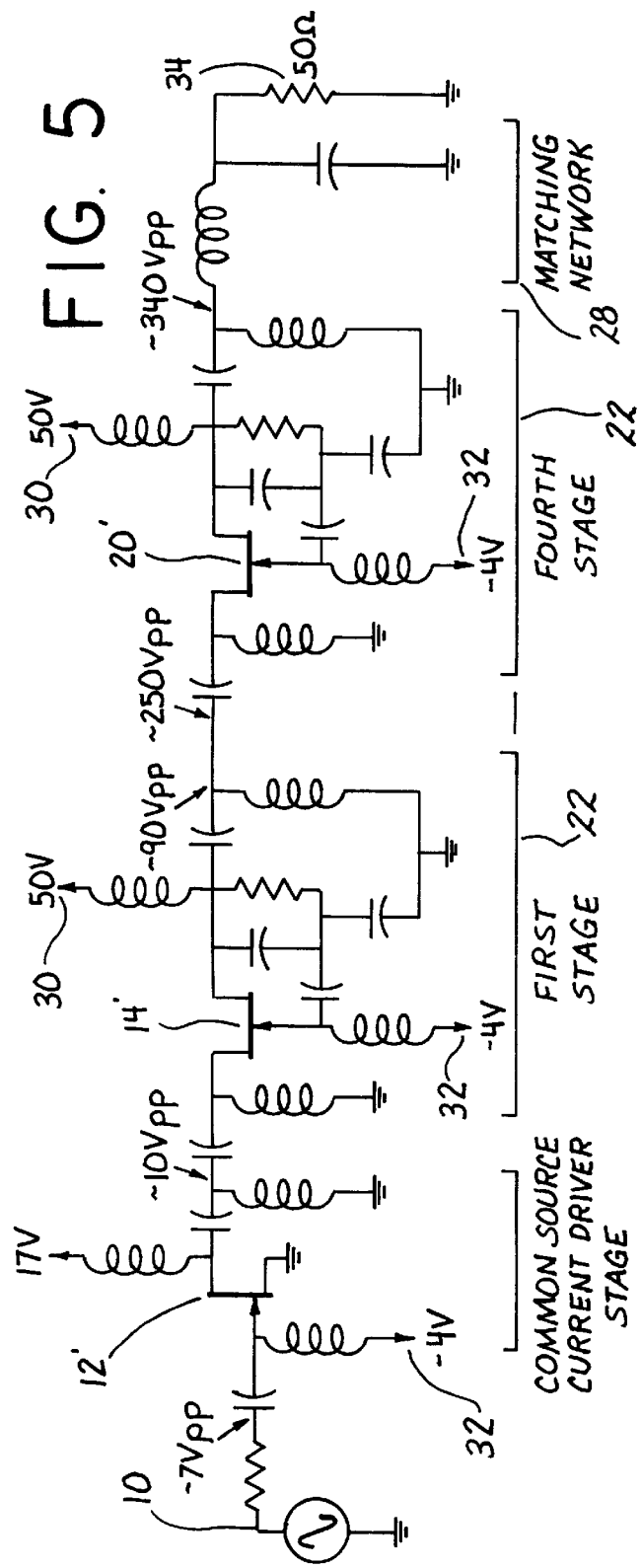
FIG. 5 is a schematic showing the details of the FET transistor model and design specifications described for a four stage amplifier in connection with Fig.

The series connected structure is driven by a common source driver stage 12' to limit the input power requirement. Each stage 22 has its own DC power supply at the drain and a DC return at the source. Thus for the purpose of DC biasing, all the stages are in parallel while adding RF power in series. The design requires only a 50 V DC supply 30 and a −4 V DC power supply 32, which is a particular additional advantage of the invention. FIG. 5 is a schematic showing the details of the FET transistor model and design specifications just described for a four stage amplifier. As before an input signal at 10 is coupled to a common source current driver stage 12' and then four SiC MesFet stages 22, a matching network 28 and thence into a 50 ohm load 34. In the design of FIG. 5 each transistor 14', 16', 18' and 20' has $f_T \approx 9.5$ GHz, $V_{br} \approx 110$ v, $I_{dss} \approx 250$ mA/mm and $V_p \approx 10$v, where $V_p$ is the pinch-off voltage, with a $V_{ds}$ swing of 10–90v and an $I_{ds}$ swing of 0 to $I_{dss}$ in phase. $I_{ds}$ is the drain-to-source current. The output of 1350 watts is delivered to a 11 ohm load at 3.5 GHz. A typical stage 22 in the stack of FIG. 5 with its compensation circuit and tuning circuit is shown in the schematic of FIG. 6 with typical values for the circuit elements for the embodiment just described.

Figure 6:
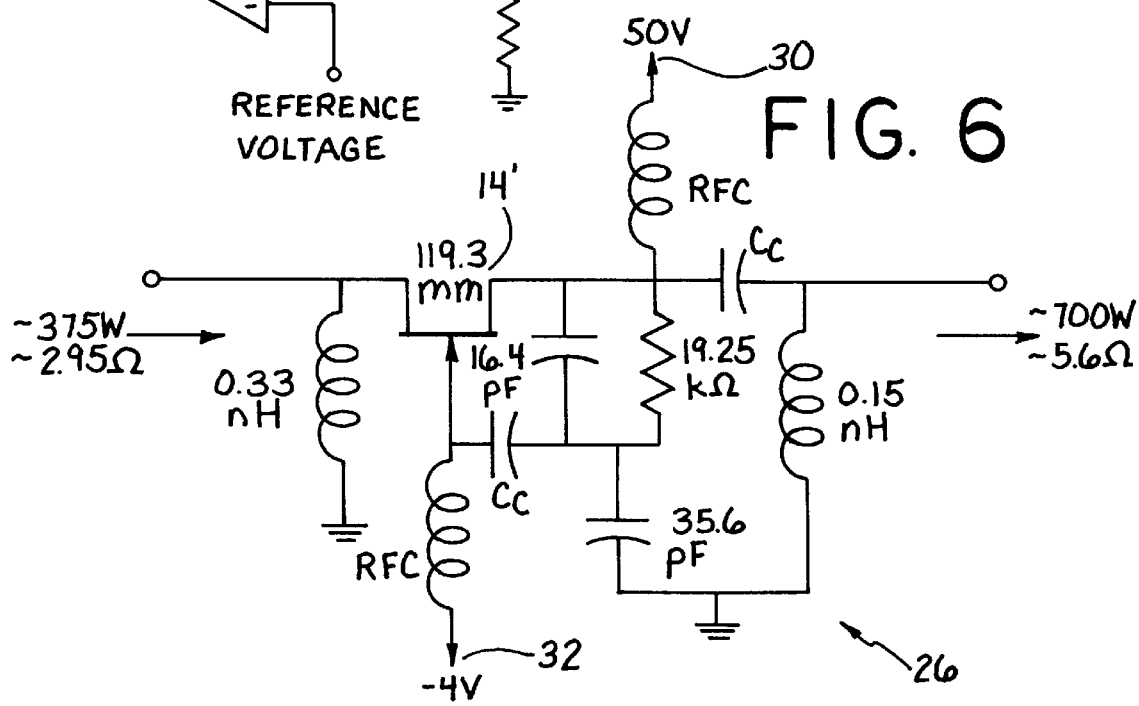
FIG. 6 is a schematic of a typical stage in the stack of FIG. 5 with its compensation circuit and tuning circuit is shown with typical values for the circuit elements.

FIG. 7 is a graph which shows the dynamic load line of an FET transistor 14', 16', 18' and 20' in FIGS. 5 and 6. The dynamic load line is the plot of instantaneous drain current, $I_{ds}$, of the FET transistor 14', 16', 18' and 20' plotted against the drain to source voltage, $V_{ds}$. It is a well known fact that for the FET class A operation to be most efficient, the load line should be linear, i.e. current out of the drain should be in phase with the drain-to-source voltage, $V_{ds}$, with the drain current swing from zero to $I_{dss}$ and $V_{ds}$ swinging from $V_{knee}$ to $V_{br}$, where $V_{knee}$ is the knee voltage in the FET $I_{ds}$-$V_{ds}$ characteristics. The nearly linear load line in FIG. 7 with optimum $V_{ds}$ and $I_{ds}$ swings signifies an efficient class A operation and maximum power output from stage 22.

FIG. 8 is a graph which shows the voltages at the input of each stage 22 in the stack of FIG. 5. $V_{in\ 1}$ is the voltage input to the first stage; $V_{in2}$ is the voltage input to the second stage or the output of the first stage; $V_{in3}$ is the voltage input to the third stage or the output of the second stage; $V_{in4}$ is the voltage input to the fourth stage or the output of the third stage; and $V_{out4}$ is the final stage output. The voltage at the output $V_{out4}$ is approximately $4V_{br}$. There is a fourfold increase in voltage and a 16-fold increase in power.

Figure 11:
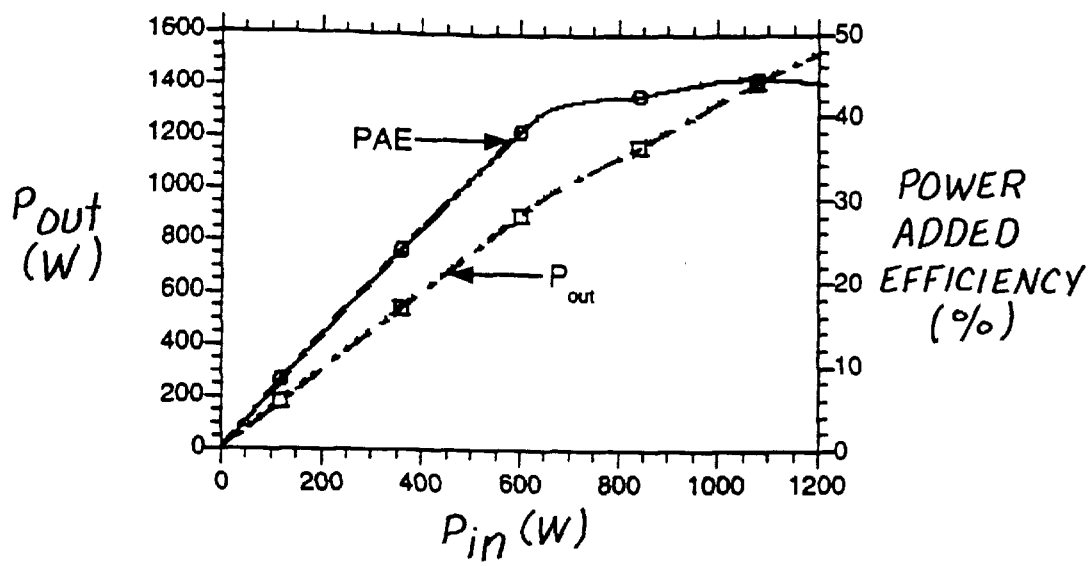
FIG. 11 is for class A operation for that of the third stage of FIG. 5.
Figure 12:
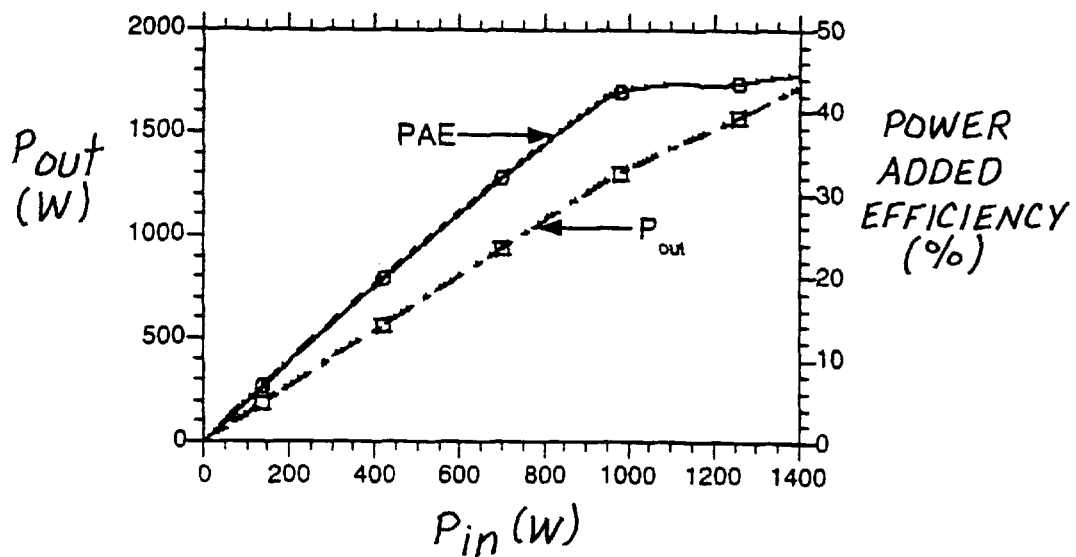
FIG. 12 is for class A operation for that of the fourth stage of FIG. 5.
Figure 13:
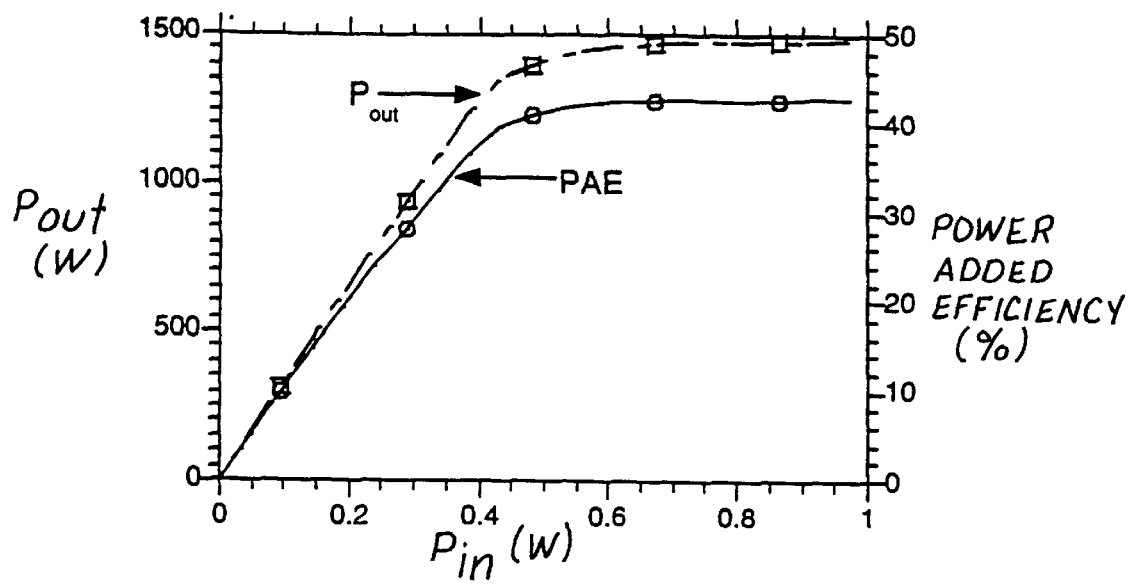
FIG. 13 is for class A operation for that of all four stages 22 of FIG. 5.

FIGS. 9–13 are graphs which show the curves for power output, Pout, plotted against power input, Pin, for the different stages 22 in FIG. 5. The class A power output is shown in each figure in the lower line labeled $P_{out}$, and the power added efficiency, which is defined as (RF power output–RF power input)/DC power input, is shown in the upper line in each figure and labeled PAE. FIG. 9 is the graph for class A operation of the first stage 22 of FIG. 5, FIG. 10 is for class A operation for that of the second stage 22 of FIG. 5, FIG. 11 is for class A operation for that of the third stage 22 of FIG. 5, FIG. 12 is for class A operation for that of the fourth stage 22 of FIG. 5, and FIG. 13 is for class A operation for that of all four stages 22 of FIG. 5. Maximum overall output and efficiency is obtained by designing each stage 22 for operation just at the point of gain compression.

Figure 14:
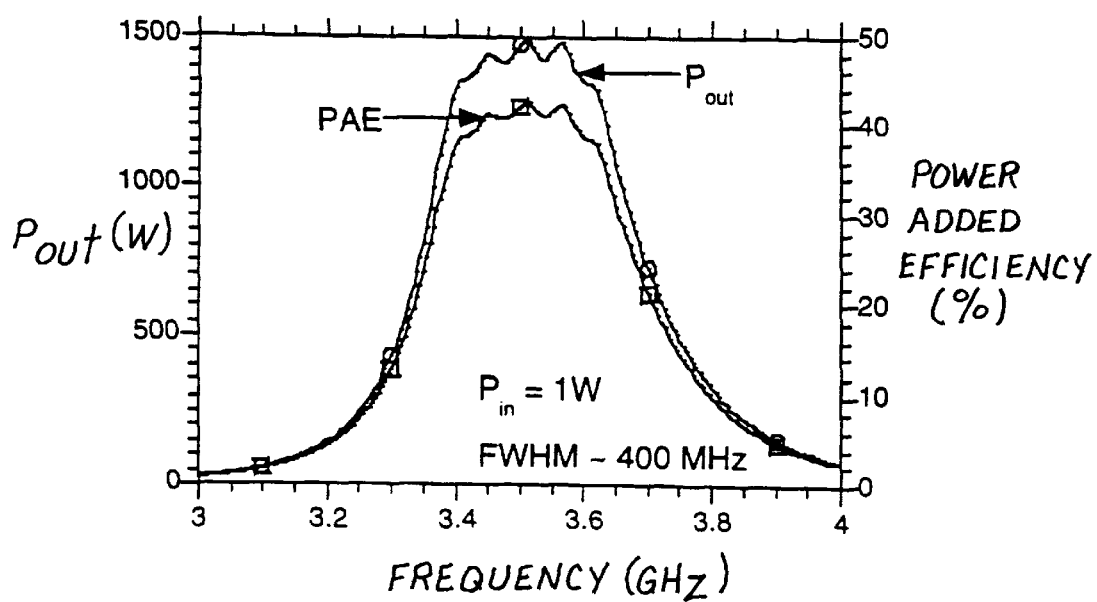
FIG. 14 is a graph which shows the frequency response of the amplifier of FIG. 5 operating at the optimum input power of 1 watt.

FIG. 14 is a graph which shows the frequency response of the amplifier of FIG. 5 operating at the optimum input power of 1 watt. The output power, Pout, is graphed on the left vertical scale, the power added efficiency on the right vertical scale and frequency is graphed on the horizontal scale. The two corresponding curves are as before labeled Pout for output power and PAE for power added efficiency. The full width half maximum is about 400 MHz.

The illustrated embodiment thus describes a series connected power amplifier capable of delivering 1450 W of power into an 11 ohm load with a power added efficiency of 43%. The low sensitivity of the design to component values results in a 400 MHz bandwidth. In contrast, a single transistor amplifier operating with a 11 ohm load would have yielded a maximum of 80 W power output.

The technique can be extended to the so-called "class B" operation. Class B operation is a standard microwave power amplifier operation mode where the standby current and hence the power consumed by the transistor is zero with currents drawn in the drain only when signal to be amplified is applied at the input. This operation is clearly more efficient than class A operation because of the reduced DC power consumption. Such class B operation is readily implemented in the series connected configuration as discussed below.

In any class B implementation, the FETs are biased at cutoff. Therefore, the current in the FET transistors 14, 16, 18 and 20 or transistors 14', 16', 18' and 20' will be a rectified sine wave having harmonics at odd multiples of the fundamental. Therefore, the harmonic terminations or a short circuit at the second harmonic and a load of the $(V_{br}-V_{knee})/I_{dss}$ fundamental need to be provided at source and drain of each transistor 14, 16, 18 and 20 or transistor 14', 16', 18' and 20'. Moreover, as $V_{gs,dc}=-V_p$, where $V_{gs,dc}$ is the DC gate-to-source voltage, feedback network 26 has to be designed at the fundamental frequency for a $V_{gs}$ swing of $2V_p$. The short circuit termination at source and drain is provided by simple LC resonators.

These features are incorporated into a series connected power amplifier configuration providing class B operation. FIGS. 15–19 are graphs analogous to FIGS. 9–14 which show the $P_{out}$ vs. $P_{in}$ for different stages of the stack of FIG. 5 when modified to operate in a class B operation. As before FIG. 15 is the graph for class B operation of the first stage 22 of FIG. 5, FIG. 16 is that for class B operation of the second stage 22 of FIG. 5, FIG. 17 is that for class B operation of the third stage 22 of FIG. 5, FIG. 18 is that for class B operation of the fourth stage 22 of FIG. 5, and FIG. 19 is that for class B operation of all four stages 22 of FIG. 5. FIG. 20 analogous to FIG. 14 shows the frequency response for the stack operating at its optimum input power in Class B operation. The class B operation shows a significantly improved power added efficiency of 62% while maintaining nearly same bandwidth as in class A operation.

The illustrated embodiment of the class B operation is thus a series connected power amplifier design capable of delivering 1200 W of power into a 12 ohm load with a power added efficiency of 62%. The bandwidth is not affected and remains approximately 400 MHz. The efficiency and the bandwidth can both be increased by an improved broadband resonators for second harmonic terminations.

Improvement over the prior art can now be clearly understood. The prior art uses a DC bias network to ensure the operation of all transistors under the same DC conditions. There is a global voltage feedback network for distribution of the voltages. The prior art in microwave series connected amplifiers achieves a maximum power added efficiency of only about 20%.

The addition of the local voltage feedback distribution networks provide correct voltage distribution and equal current distribution for all transistors, such that the peak-to-peak voltage and current swings of each transistor can be set simultaneously to the values required for efficient amplifier operation. The method applies to both FETs and bipolar transistors. The series connected microwave power amplifier is thus characterized as a stack with local voltage feedback networks which provide an equal distribution of voltage across the transistors in the stack.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A frequency selective microwave power amplifier comprising a plurality of series connected stages wherein each stage comprises:

a transistor having an output; and a frequency selective local negative feedback network for each stage coupled to said output of said transistor and feeding back an ac signal to said transistor independently of the number of stages in said plurality of series connected stages to provide a substantially equal distribution of ac and dc voltages across said plurality of transistors in said corresponding plurality of stages allowing for output voltages of amplifier larger than breakdown voltage of any individual transistor in the series, whereby increased power performance of said amplifier is achieved.

2. The microwave amplifier of claim 1 wherein said transistor is a field effect transistor.

3. The microwave amplifier of claim 1 wherein said transistor is a bipolar junction transistor.

4. The microwave amplifier of claim 1 further comprising a current driver input stage coupled to a first one of said plurality of series connected stages.

5. The microwave amplifier of claim 4 wherein said current driver input stage comprises a common source current driver.

6. The microwave amplifier of claim 4 wherein said current driver input stage comprises a common emitter current driver.

7. The microwave amplifier of claim 1 further comprising a DC biasing circuit in series with each of said plurality of series connected stages so that dc current in all series connected stages is set simultaneously by the DC biasing circuit, while providing equal dc voltage across each of the said plurality of stages.

8. The microwave amplifier of claim 1 further comprising a DC biasing circuits in parallel with each of said plurality of series connected stages so that the dc voltage across each of plurality of series connected stages is set simultaneously by said DC biasing circuit, while establishing equal dc current in each of the said plurality of stages.

9. A microwave amplifier comprising a plurality of series connected stages wherein each stage comprises:

a transistor having an output;

a negative feedback network coupled to said output of said transistor and feeding back a signal to said transistor to provide a substantially equal distribution of voltage across said plurality of transistors in said corresponding plurality of stages, whereby increased power performance of said amplifier is achieved, and a DC biasing circuit in parallel with each of said plurality of series connected stages wherein an RF input signal is applied in series to said plurality of series connected stages, wherein said DC biasing circuit provides only two DC power supply voltages in parallel with each of said plurality of series connected stages.

10. The microwave amplifier of claim 1 wherein said transistor has an input, wherein said feedback network has an output, and wherein each stage further comprises a first load line matching circuit coupled to said input of said transistor and second load line matching circuit coupled to said output of said feedback network.

11. The microwave amplifier of claim 10 wherein said a plurality of series connected stages are each biased for class A operation.

12. A microwave amplifier comprising a plurality of series connected stages wherein each stage comprises:

a transistor having an output; and a negative feedback network coupled to said output of said transistor and feeding back a signal to said transistor to provide a substantially equal distribution of voltage across said plurality of transistors in said corresponding plurality of stages, whereby increased power performance of said amplifier is achieved wherein said transistor has an input, wherein said feedback network has an output, and wherein each stage further comprises a first load line matching circuit coupled to said input of said transistor and second load line matching circuit coupled to said output of said feedback network, wherein said a plurality of series connected stages are each biased and tuned for class B operation.

13. The microwave amplifier of claim 8 wherein said transistor of each said stage is a field effect transistor with a source-drain voltage, $V_{ds}$, and a drain current and wherein said biasing circuit biases said field effect transistor at optimum efficiency where said drain current and said source-drain voltage, $V_{ds}$, are in phase with each other.

14. The microwave amplifier of claim 1 wherein said transistor of each said stage is driven through its corresponding maximum voltage input range for maximum power output.

15. A microwave amplifier comprising a plurality of series connected stages wherein each stage comprises: a transistor having an output; and a negative feedback network coupled to said output of said transistor and feeding back a signal to said transistor to provide a substantially equal distribution of voltage across said plurality of transistors in said corresponding plurality of stages, whereby increased power performance of said amplifier is achieved, where said feedback network of each stage is tuned to provide a voltage gain of said stage of $(N+1)/N$ where N is the cardinal number of said corresponding stage among said plurality of stages.

16. A microwave amplifier comprising a plurality of series connected stages wherein each stage comprises: a transistor having an output; and a negative feedback network coupled to said output of said transistor and feeding back a signal to said transistor to provide a substantially equal distribution of voltage across said plurality of transistors in said corresponding plurality of stages, whereby increased power performance of said amplifier is achieved, wherein said transistor has an input, wherein said feedback network has an output, and wherein each stage further comprises a first load line matching circuit coupled to said input of said transistor and second load line matching circuit coupled to said output of said feedback network, wherein said first load line matching circuit of each stage is tuned to provide an input impedance of said stage Of $I_{n\ N}=(N-1)B_{reakdown}/I_{ds}$, where $I_{n\ N}$ is the input impedance of the Nth stage of said plurality of stages, where N is the cardinal number of said corresponding stage among said plurality of stages, $B_{reakdown}$ is the breakdown voltage of said Nth stage, and $I_{ds}$ is source-to-drain saturation current of said Nth stage.

17. A microwave amplifier comprising a plurality of series connected stages wherein each stage comprises: a transistor having an output; and a negative feedback network coupled to said output of said transistor and feeding back a signal to said transistor to provide a substantially equal distribution of voltage across said plurality of transistors in said corresponding plurality of stages, whereby increased power performance of said amplifier is achieved, wherein said transistor has an input, wherein said feedback network has an output, and wherein each stage further comprises a first load line matching circuit coupled to said input of said transistor and second load line matching circuit coupled to said output of said feedback network, wherein said second load line network of each stage provides a load impedance for an Nth stage given by $I_{in\ N}=(N-1)\ V_{breakdown}/I_{dss}$ where $Z_{in\ N}$ is the load impedance of said Nth stage, where N is the cardinal number of said corresponding stage among said plurality of stages, $V_{reakdown}$ is the breakdown voltage of said Nth stage, and $I_{dss}$ is the source-to-drain saturation current of said Nth stage.

18. The microwave amplifier of claim 16 wherein said second load line network of each stage provides a load impedance for an Nth stage given by $Z_{load\ N}=N\ V_{breakdown}/I_{dss}$ where $Z_{load\ N}$ is the load impedance of said Nth stage, where N is the cardinal number of said corresponding stage among said plurality of stages, $V_{breakdown}$ is the breakdown voltage of said Nth stage, and $I_{dss}$ is the source-to-drain saturation current of said Nth stage.

19. A microwave amplifier comprising a plurality of series connected stages wherein each stage comprises: a transistor having an output; and a negative feedback network coupled to said output of said transistor and feeding back a signal to said transistor to provide a substantially equal distribution of voltage across said plurality of transistors in said corresponding plurality of stages, whereby increased power performance of said amplifier is achieved, wherein said transistor has an input, wherein said feedback network has an output, and wherein each stage further comprises a first load line matching circuit coupled to said input of said transistor and second load line matching circuit coupled to said output of said feedback network, wherein said DC biasing circuit biases said transistor in each of said stages at cutoff and wherein said first and second 3 load line networks are each harmonic terminations.

20. The microwave amplifier of claim 1 wherein said feedback networks in said stages provide an equal ac voltage distribution and equal current distribution among said corresponding transistors in said plurality of stages in a frequency band of interest so that peak-to-peak voltage and current swings in each of said plurality of stages are simultaneously set to have a minimum phase difference so as to achieve increased efficient operation of said amplifier.

21. The microwave amplifier of claim 20 where voltage across said plurality of stages is equally distributed across said plurality of corresponding transistors.

22. A method of operating a microwave amplifier comprising a plurality of series connected stages comprising:

provising an input signal to a selected one of said plurality of series connected stages;

amplifying said input signal by a transistor in said corresponding stage provided with a local negative feedback having a feedback gain $\beta_{fb} \approx N/(N+1)$, where N is the cardinal number of said corresponding stage among said plurality of stages and which is equal to 1 for said first stage, to provide an output signal from said corresponding stage to serve as an input signal to a next one of said series connected stages; and repeating said steps of providing said input signal and amplifying said signal in sequence for each of said stages of said plurality of stages.

23. The method of claim 22 where providing said input signal to said transistor is provided through a tuned input impedance of $Z_{in\ N} = (N-1)V_{breakdown}/I_{dss}$, where $Z_{in\ N}$ is the input impedance of the Nth stage of said plurality of stages, where N is the cardinal number of said corresponding stage among said plurality of stages, $V_{breakdown}$ is the breakdown voltage of said Nth stage, and $I_{dss}$ is the source-to-drain saturation current of said Nth stage.

24. The method of claim 22 where providing said input signal to said transistor further comprises biasing said transistor to cutoff and coupling input and output of said transistor to two harmonic terminations through one of which harmonic terminations said input signal is coupled to said transistor and to the other of which harmonic terminations said input signal is amplified and output for class B operation.

25. The method of claim 22 where amplifying said input signal is amplified by said transistor and output to a tuned load impedance of $Z_{load\ N} = N\ V_{breakdown}/I_{dss}$ where $Z_{load\ N}$ is the load impedance of said Nth stage, where N is the cardinal number of said corresponding stage among said plurality of stages, $V_{breakdown}$ is the breakdown voltage of said Nth stage, and $I_{dss}$ is the source-to-drain saturation current of said Nth stage.

* * * * *